(12) United States Patent
Corona et al.

(10) Patent No.: US 9,162,876 B2
(45) Date of Patent: Oct. 20, 2015

(54) PROCESS FOR MANUFACTURING A MEMBRANE MICROELECTROMECHANICAL DEVICE, AND MEMBRANE MICROELECTROMECHANICAL DEVICE

(75) Inventors: Pietro Corona, Milan (IT); Marco Ferrera, Concorezzo (IT); Igor Varisco, Milan (IT); Roberto Campedelli, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 604 days.

(21) Appl. No.: 13/419,230

(22) Filed: Mar. 13, 2012

(65) Prior Publication Data
US 2012/0237061 A1    Sep. 20, 2012

(30) Foreign Application Priority Data
Mar. 18, 2011    (IT) .............................. TO2011A0241

(51) Int. Cl.
*B81C 1/00*    (2006.01)
*G01L 9/00*    (2006.01)

(52) U.S. Cl.
CPC ......... *B81C 1/00158* (2013.01); *B81C 1/00293* (2013.01); *G01L 9/0042* (2013.01); *G01L 9/0073* (2013.01); *B81B 2201/0257* (2013.01); *B81B 2203/0127* (2013.01); *B81C 2203/0145* (2013.01)

(58) Field of Classification Search
None
See application file for complete search history.

(56) References Cited

U.S. PATENT DOCUMENTS

| | | |
|---|---|---|
| 4,978,421 A | 12/1990 | Bassous et al. |
| 4,996,627 A | 2/1991 | Zias et al. |
| 5,068,203 A | 11/1991 | Logsdon et al. |
| 5,589,810 A | 12/1996 | Fung |
| 5,888,845 A | 3/1999 | Bashir et al. |
| 6,012,335 A | 1/2000 | Bashir et al. |
| 6,128,961 A | 10/2000 | Haronian |
| 6,131,466 A | 10/2000 | Vigna et al. |
| 6,417,021 B1 | 7/2002 | Vigna et al. |
| 6,959,608 B2 | 11/2005 | Bly et al. |
| 7,578,196 B2 | 8/2009 | Riccoti et al. |
| 8,182,590 B2 | 5/2012 | Striemer et al. |
| 2005/0208696 A1 | 9/2005 | Villa et al. |
| 2007/0298238 A1* | 12/2007 | Witvrouw et al. ......... 428/304.4 |

(Continued)

FOREIGN PATENT DOCUMENTS

| | | |
|---|---|---|
| DE | 100 32 579 A1 | 1/2002 |
| EP | 1 452 844 A1 | 9/2004 |

(Continued)

*Primary Examiner* — Duy Deo
(74) *Attorney, Agent, or Firm* — Seed IP Law Group PLLC (57) ABSTRACT

Disclosed herein is a microelectromechanical device and a process for manufacturing same. One or more embodiments may include forming a semiconductor structural layer separated from a substrate by a dielectric layer, and opening a plurality of trenches through the structural layer exposing a portion of the dielectric layer. A sacrificial portion of the dielectric layer is selectively removed through the plurality of trenches in membrane regions so as to free a corresponding portion of the structural layer to form a membrane. To close the trenches, the wafer is brought to an annealing temperature for a time interval in such a way as to cause migration of the atoms of the membrane so as to reach a minimum energy configuration.

20 Claims, 5 Drawing Sheets

(56) References Cited

U.S. PATENT DOCUMENTS

2009/0283846 A1    11/2009   Seesink et al.
2011/0198746 A1*   8/2011    Verhelijden et al. .......... 257/729

FOREIGN PATENT DOCUMENTS

| EP | 1 577 656 A1 | 9/2005 |
| WO | 2009144619 A2 | 12/2009 |

* cited by examiner

PROCESS FOR MANUFACTURING A MEMBRANE MICROELECTROMECHANICAL DEVICE, AND MEMBRANE MICROELECTROMECHANICAL DEVICE

BACKGROUND

1. Technical Field

The present disclosure relates to a process for manufacturing a membrane microelectromechanical device and to a membrane microelectromechanical device.

2. Description of the Related Art

As is known, semiconductor-machining techniques have made it possible to provide membrane microelectromechanical devices that may be used as sensors or transducers in various applications. For example, known to the art are capacitive pressure sensors, in which a semiconductor membrane separates a reference pressure chamber from the external environment. The difference between the external pressure and the reference pressure modifies the configuration of the membrane and hence the capacitive coupling between the membrane itself and the opposite wall of the chamber. In other cases, the deformation of the membrane is detected by exploiting the piezoresistive properties of monocrystalline silicon. Microelectromechanical membrane transducers are frequently used also as microphones.

The manufacture of membrane microelectromechanical devices is, however, rather problematical and, notwithstanding their wide diffusion, known processes suffer from certain limitations.

According to a known process, membrane microelectromechanical devices are obtained from semiconductor wafers comprising a substrate, an insulating layer, and a semiconductor structural layer, of a thickness substantially equal to the thickness of the membrane to be obtained. The structural layer may be monocrystalline, as in the case of silicon on insulator (SOI) wafers, or else polycrystalline. The back of the substrate is etched in an area corresponding to the membrane, as far as the insulating layer. The exposed portion of the insulating layer is then removed so as to free a portion of the structural layer, which forms the membrane.

Substrate etch is, however, critical, both from the standpoint of costs and because the large thickness of the substrate (several hundreds of microns) poses problems of alignment and of feasibility of the etch. In addition, the device obtained does not include any stopper structure capable of limiting the extension of the membrane towards the side of the substrate. The membrane is hence not protected and may undergo failure.

According to another known process, in a SOI wafer, which comprises a substrate, an insulating layer, and a monocrystalline structural layer, a sacrificial portion of the dielectric layer is selectively removed through apertures made in the structural layer, which forms a membrane. The apertures are closed by depositing dielectric material. The quality of the devices that can be obtained with the process described, however, is not optimal. In fact, the membranes thus obtained present discontinuities that can give rise to structural defects or cracks, both during machining and in use, as a result of the stresses. The relative brittleness of the membranes moreover requires rather large minimum thicknesses.

Other processes envisage opening a plurality of adjacent trenches directly in the substrate, possibly closing the trenches by an epitaxial growth, and then carrying out an annealing step with a temperature and duration such as to cause complete migration of the material, which forms diaphragms between the trenches. In this way, all the trenches join up in a single cavity closed by a membrane. Solutions of this type are, however, very difficult to control, especially with regards to a crucial parameter as the final thickness of the membrane, and in any case are rather complex.

BRIEF SUMMARY

One or more embodiments of the present disclosure are directed to a process for manufacturing a microelectromechanical device and a microelectromechanical device that are free from one or more of the limitations described.

BRIEF DESCRIPTION OF THE SEVERAL VIEWS OF THE DRAWINGS

For a better understanding of the disclosure, some embodiments thereof will now be described, purely by way of non-limiting example and with reference to the attached drawings, wherein.

DETAILED DESCRIPTION

Figure 1:
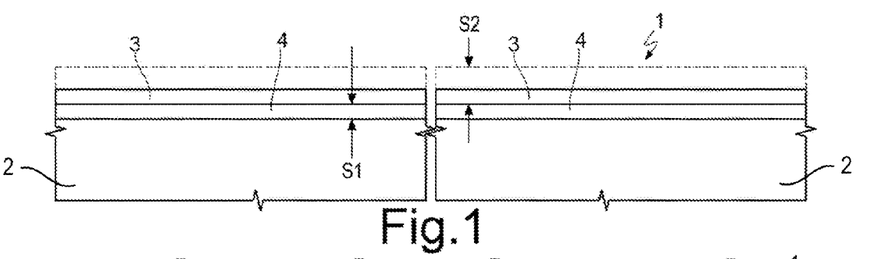
FIG. 1 is a cross section through a semiconductor wafer in an initial step of a process for manufacturing a microelectromechanical device according to one embodiment of the present disclosure.

With reference to FIG. 1, a semiconductor wafer of a SOI type is designated as a whole by 1 and comprises a substrate 2, made of monocrystalline silicon, a structural layer 3, which is also made of monocrystalline silicon, and a dielectric layer 4, arranged between the substrate 2 and the structural layer 3. In one embodiment, the thickness 51 of the dielectric layer 4 is 1 µm.

By epitaxial growth, the structural layer 3 is extended as far as a desired thickness S2, for example of between 1 µm and 5 µm. In the embodiment described and illustrated herein, the thickness S2 of the structural layer 3 after the epitaxial growth is 2.5 µm.

Figure 2:
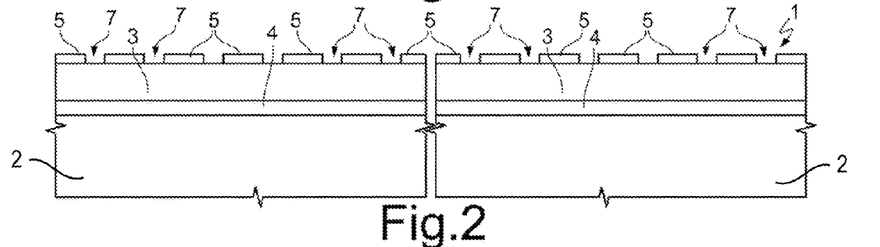
FIG. 2 shows the wafer of FIG. 1 in a subsequent step of the manufacturing process.
Figure 3:
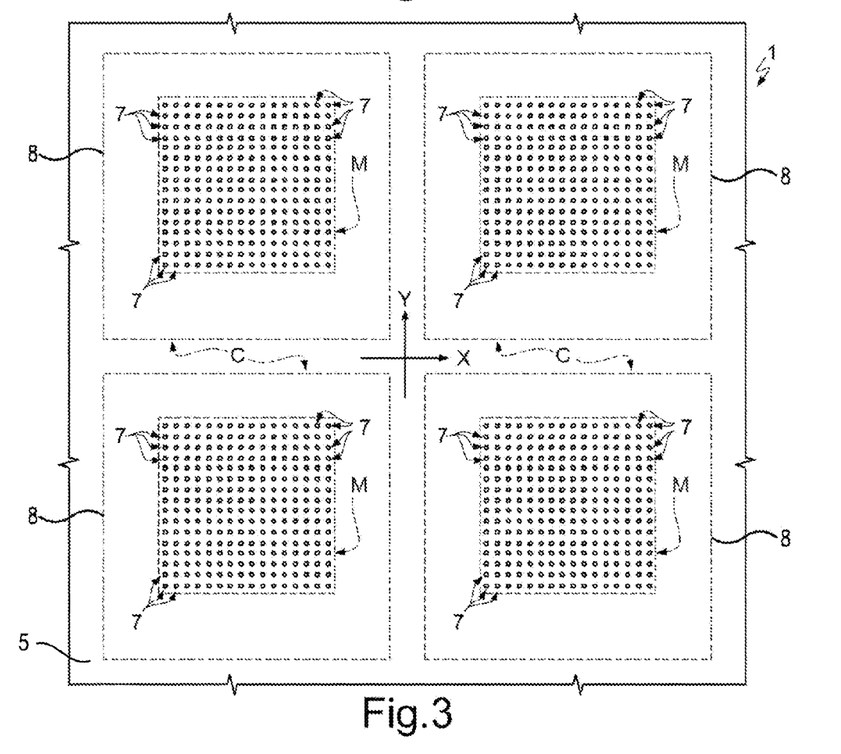
FIG. 3 is a top plan view of the wafer of FIG. 1, at a reduced scale.
Figure 4:
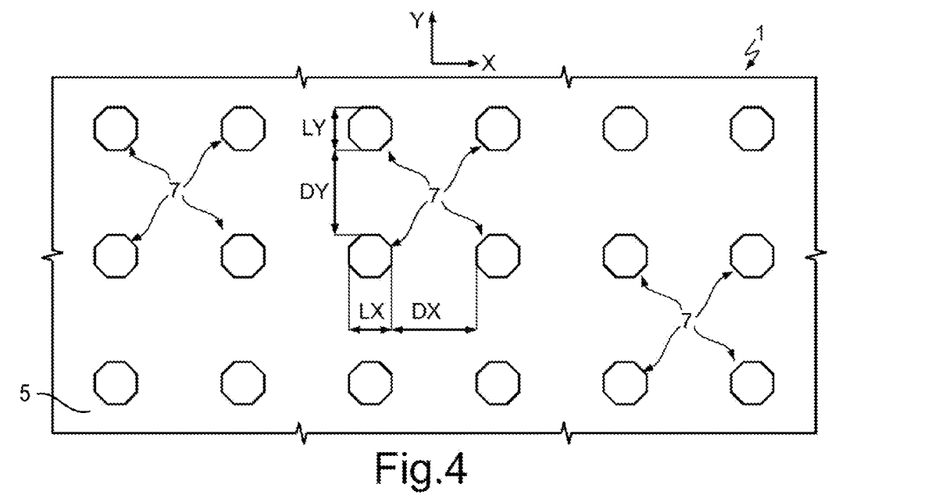
FIG. 4 shows an enlarged detail of the view of FIG. 3.

As shown in FIGS. 2-4, a mask 5 is formed on the structural layer 3. The mask 5 has apertures 7 arranged in an array in rows and columns along a first direction X and a second direction Y, respectively.

The apertures 7 are uniformly distributed in regions M intended for membranes, as may be seen in particular in FIG. 3, which shows also regions C, corresponding to chips that will be obtained from the wafer 1, and scribe lines 8. In each region M, the ratio between the area of the solid portion of the mask 5 and the areas of the apertures 7 (in plan view) is 3:1 or higher.

In the embodiment of FIGS. 2-4, the apertures have an octagonal shape. It is to be appreciated, however, that the apertures may be any shape. In some embodiments, the distance between adjacent apertures 7 in any direction is greater than the width of the apertures 7 in the same direction. In the embodiment illustrated, in particular, the distances DX, DY between adjacent apertures 7 along the first direction X and in the second direction Y, respectively, are more than twice the widths LX, LY, respectively, of the apertures 7 in the same directions.

Figure 5:
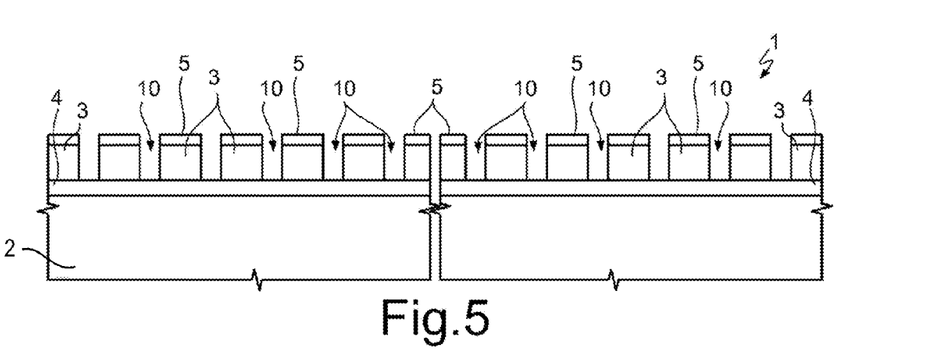
FIGS. 5-8 show the view of FIG. 2, in subsequent machining steps.

The structural layer 3 is then etched through the mask 5 until the dielectric layer 4 is reached, as illustrated in FIG. 5. Trenches 10 are thus opened, which have, in plan view, substantially the same shape as the apertures 7. The trenches 10 extend as far as the dielectric layer 4, which is in part exposed. The ratio between the area of the structural layer 3 in the regions M and the areas of cross-sections of the trenches 10 (in plan view) is substantially equal to the ratio between the area of the solid portion of the mask 5 and the apertures 7 (higher than 3:1 and about 8:1 in the embodiment described).

Figure 6:
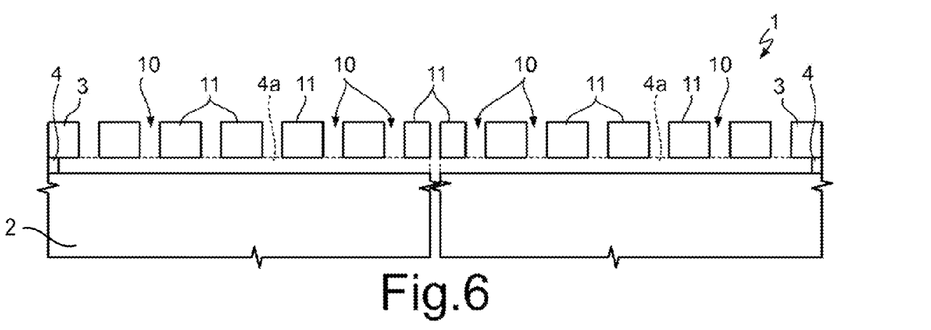

After removal of the mask 5, the dielectric layer 4 is etched in hydrofluoric acid through the trenches 10, as shown in FIG. 6. The etch removes sacrificial portions 4a of the dielectric layer 4 that extend as far as a frame around the trenches 10, in areas corresponding to the regions M. Corresponding portions of the structural layer 3, which form membranes 11, are thus freed.

Figures 7, 8:
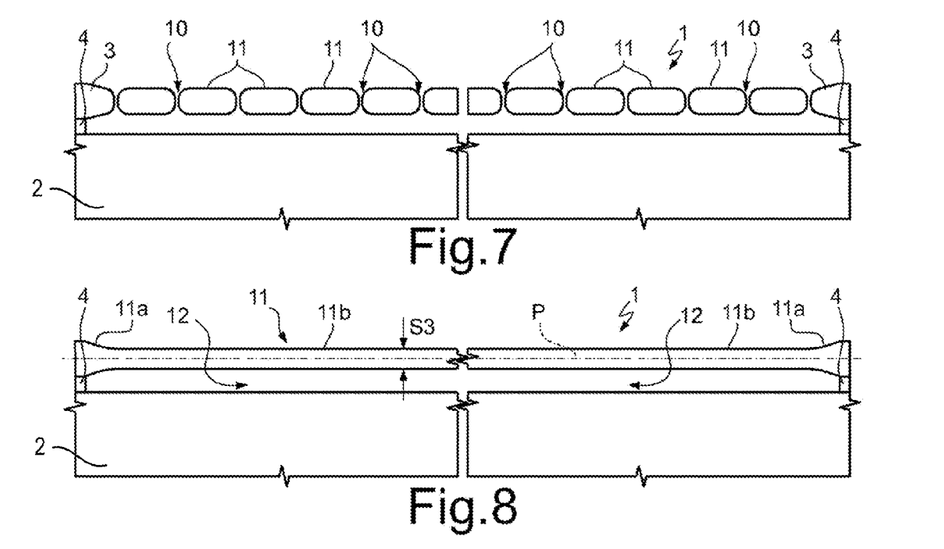

A thermal annealing step is then carried out (FIGS. 7 and 8). In some embodiments, the thermal annealing step is carried out in hydrogen or inert-gas atmosphere. The wafer 1 is brought to an annealing temperature for a time interval in such a way as to cause a migration of the silicon atoms, which tend to reach a configuration of minimum energy. In some embodiments, the annealing temperature is between approximately 1100° C. and approximately 1250° C. and is maintained for a time interval of between approximately 5 and approximately 30 minutes. In one embodiment, in particular, the annealing temperature is 1200° C. and is maintained for 20 minutes.

Basically, in this step, the silicon that forms each membrane 11 tends to arrange itself in a regular way, maintaining the monocrystalline structure, and to eliminate the irregularities present, in particular closing the trenches 10 (FIG. 7 shows the wafer 1 in an intermediate step of the annealing, whereas in FIG. 8 the annealing is completed and the membrane 11 is in its final configuration).

At the end of the annealing step, the membranes 11 have a continuous and homogeneous structure of monocrystalline silicon and delimit, with the substrate 2 and with the dielectric layer 4, reference chambers 12, only one of which is shown in FIG. 8. More precisely, the reference chamber 12 is defined in a discontinuity of the dielectric layer 4, corresponding to a respective one of the regions M.

As a result of migration and of filling of the trenches 10, the membrane 11 thins out. In greater detail, the membrane 11 has a transition region 11a at the margins and a central portion 11b. The transition region 11a has a tapered cross section and connects the central portion 11b, which is thinner, to the structural layer 3, the thickness of which has remained unvaried during the annealing step. The transition region is symmetrical both along the entire perimeter of the membrane 11 and with respect to a median plane P parallel to the area of the substrate 2.

The initial thickness S2 of the structural layer 3 and the density and size of the trenches 10 (in practice, the ratio between the area of the structural layer 3 in the regions M and the areas of the trenches 10, in plan view) determine the thickness S3 of the membrane 11, which in the illustrated embodiment is of between about 1 μm and about 3 μm.

The process is completed with implantation and metallization steps to provide capacitive or piezoelectric devices. In the former case, the insulation offered by the dielectric layer 4 is used, while in the latter case the piezoelectric properties of the monocrystalline silicon that forms the membrane 11 are exploited.

Figure 9:
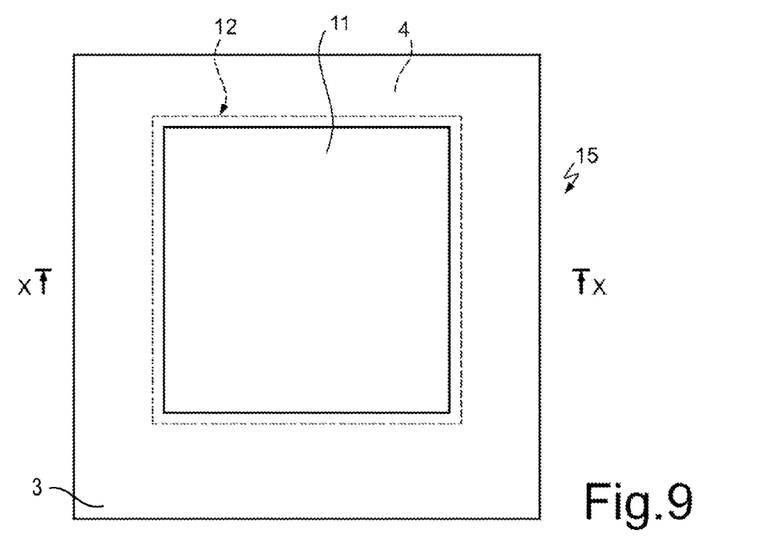
FIG. 9 is a top plan view of a semiconductor chip obtained by dicing the wafer of FIG. 8 incorporating a microelectromechanical device according to one embodiment of the present disclosure.
Figure 10:
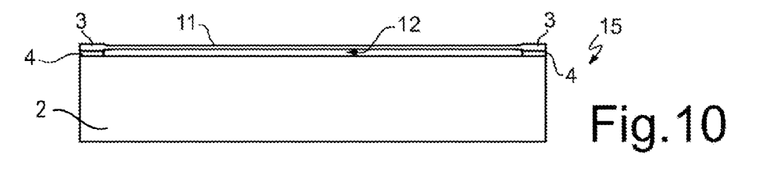
FIG. 10 is a cross section of the chip of FIG. 9, taken along the line X-X of FIG. 9.

The wafer 1 is then divided into chips, each of which comprises a respective membrane device 15, as illustrated in FIG. 9.

The process described may have one or more advantages.

In one embodiment, the process enables an extremely thin membrane to be obtained and extremely precise control of the thickness thereof, which can reach about 1 μm.

In turn, the small thickness enables devices, sensors, or transducers with very high sensitivity to be obtained, which, moreover, have dimensions much smaller than those of conventional membrane devices. In other words, very small differences of pressure are sufficient to cause significant and detectable deformations of the membrane, and hence the devices are extremely sensitive. The ease of deformation of the membrane on account of the small thickness that can be obtained with the process described also enables reduction of the dimensions of the membrane and the area occupied by each device of up to 50% as compared to conventional devices. The reduction of area results in a saving in terms of number of devices per wafer, which abundantly compensates for the need to use SOI wafers, which are normally costly. The process according to the invention is thus advantageous also from the economic standpoint.

The process may have other important advantages. In some embodiments, the crystallographic quality of the membranes is preserved. In fact, not only is the monocrystalline structure of the structural layer of the starting SOI wafer maintained, but the annealing step enables correction of possible defects and irregularities, as well as reclosing of the trenches without leaving any imperfections. The fact that the membrane is monocrystalline then enables exploitation of the piezoelectric properties thereof.

Again, in the devices obtained by means of the process described, the membrane faces to the substrate, which functions also as stopper structure. Even in the case of marked differences of pressure between the external environment and the reference chamber, the deformation of the membrane is hence limited by the substrate, and the risks of failure are substantially eliminated.

On the other hand, the membrane obtained with the process described is electrically insulated from the substrate, and it is thus possible to obtain also devices of a capacitive type. Moreover, any undesirable electrical effects that could be caused by coupling with the substrate are prevented.

FIGS. 10-13, where parts that are the same as those already shown are designated by the same reference numbers, show masks used in different embodiments of the invention for opening the trenches in the structural layer.

Figure 11:
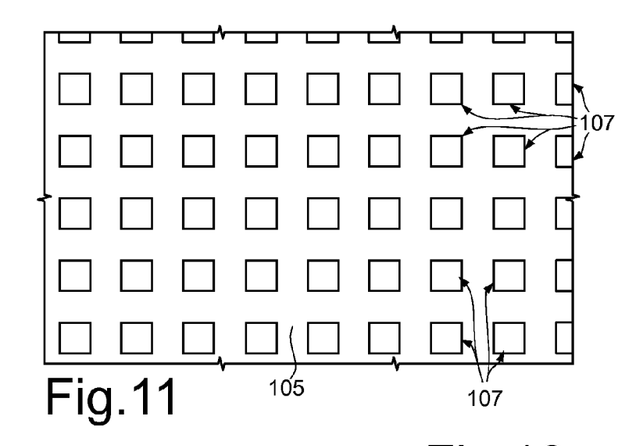
FIG. 11 shows the view of FIG. 4 according to a different embodiment of the present disclosure.

In the embodiment of FIG. 11, a mask 105 having apertures 107 that are arranged in rows and columns and have a square cross section is used for etching the structural layer 3. The apertures 107 have a side, for example, of 1 μm, and the distance between adjacent apertures 107 is about 2 μm. In this case, the ratio between the solid portion of the mask 107 and the area of the apertures 107 in the regions that house the membrane is about 3:1 (as likewise the ratio between the area of the structural layer 3 and the area of the sections of the trenches that are to be opened using the mask 105).

Figure 12:
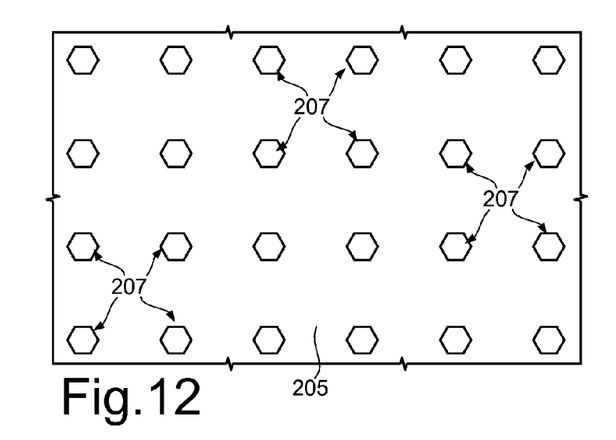
FIG. 12 shows the view of FIG. 4 according to a different embodiment of the present disclosure.

In the embodiment of FIG. 12, a mask 205 having apertures 207 that are arranged in rows and columns and have a hexagonal cross section is used. In this case, the distance between adjacent apertures 207 is twice the apothem of each aperture 207.

Figure 13:
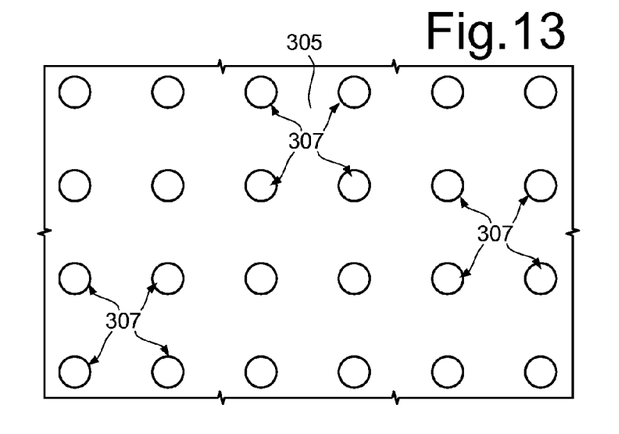
FIG. 13 shows the view of FIG. 4 according to a different embodiment of the present disclosure.

In the embodiment of FIG. 13, a mask 305 that has apertures 307 that are arranged in rows and columns and have a circular cross section is used. The distance between adjacent apertures 307 is twice the diameter of each aperture 307.

Figure 14:
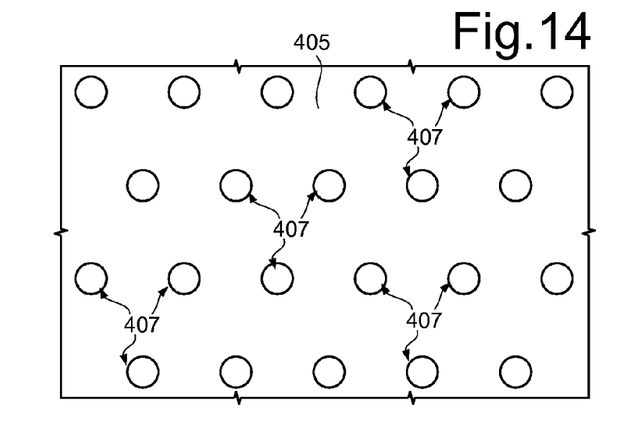
FIG. 14 shows the view of FIG. 4 according to a different embodiment of the present disclosure.

In the embodiment of FIG. 14, a mask 405 having apertures 407 that are arranged in rows and columns and have a circular cross section is used. The rows of apertures 407 are staggered. Consequently, in this case, the distance between adjacent apertures 407 of each row is twice the diameter of each aperture 407. The distance between adjacent apertures 407 of each column is, instead, greater (about five times the diameter of the apertures 407).

Figure 15:
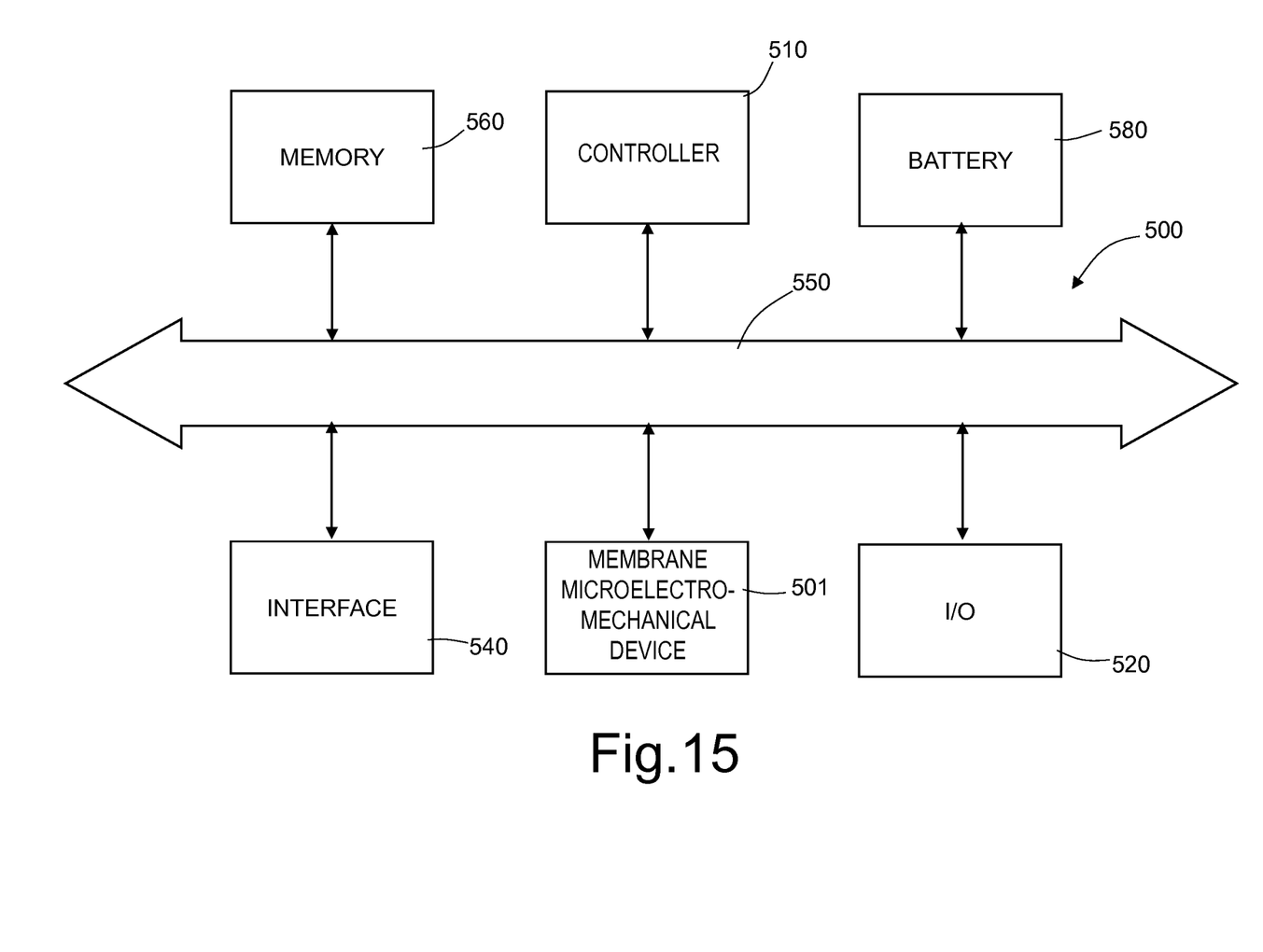
FIG. 15 is a simplified block diagram of an electronic system incorporating a microelectromechanical device according to one embodiment of the present disclosure.

FIG. 15 illustrates a portion of an electronic system 500 according to one embodiment of the present disclosure. The system 500 incorporates a membrane microelectromechanical device 501, for example a microphone, and may be used in devices, such as, for example, a palmtop computer (personal digital assistant, PDA), a laptop or portable computer, possibly with wireless capacity, a cell phone, a messaging device, a digital music player, a digital camera, or other devices designed to process, store, transmit, or receive information.

The electronic system 500 may comprise a controller 510, an input/output (I/O) device 520 (for example a keyboard or a display), the membrane microelectromechanical device 501, an interface 540, such as a wireless interface, and a memory 560, of a volatile or nonvolatile type, connected to one another through a bus 550. In one embodiment, a battery 580 may be used for supplying power to the system 500. It should be noted that the scope of the present invention is not limited to embodiments having necessarily one or all of the devices listed.

The controller 510 may comprise, for example, one or more microprocessors, microcontrollers, and the like.

The I/O device 520 may be used for generating a message. The system 500 may use the wireless interface 540 for transmitting and receiving messages to and from a wireless communication network with a radiofrequency (RF) signal. Examples of wireless interface may comprise an antenna, a wireless transceiver, such as a dipole antenna, even though the scope of the present invention is not limited from this standpoint. In addition, the I/O device 520 may supply a voltage representing what is stored either in the form of digital output (if digital information has been stored), or in the form of analog information (if analog information has been stored).

Modifications and variations may be made to the process and to the device described, without thereby departing from the scope of the present invention.

For example, further masks, with configurations different from the ones described, can be used for opening the trenches in the structural layer. The apertures of the masks, in particular, do not necessarily have to be consistent shapes, nor be distributed in a uniform way on the regions that are to house the membranes. In one embodiment, the apertures may be rectangular and extend in parallel directions or else in perpendicular directions.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process comprising:
    forming a microelectromechanical device including:
        forming a structural layer on a single dielectric layer on a semiconductor substrate, the structural layer having an inner portion and an outer portion, the dielectric layer having a sacrificial portion and a support portion;
        opening a plurality of trenches through the inner portion of the structural layer, the plurality of trenches exposing the sacrificial portion of the dielectric layer;
        selectively removing the sacrificial portion of the dielectric layer through the plurality of trenches so as to cause the inner portion of the structural layer to be suspended, thereby forming a membrane the support portion of the dielectric layer remaining between the outer portion of the structural layer and the semiconductor substrate; and
        closing the plurality of trenches, the closing the plurality of trenches including exposing the structural layer to an annealing temperature for a time interval.

2. The process according to claim 1, wherein exposing the microelectromechanical device to an annealing temperature for a time interval causes atoms of the membrane to migrate.

3. The process according to claim 1, wherein the annealing temperature is between approximately 1100° C. and approximately 1250° C.

4. The process according to claim 1, wherein the time interval has a duration of between approximately 5 minutes and approximately 30 minutes.

5. The process according to claim 1, wherein opening the plurality of trenches includes forming a mask on the structural layer and etching the structural layer using the mask.

6. The process according to claim 5, wherein the mask includes a plurality of apertures.

7. The process according to claim 6, wherein the apertures are uniformly distributed.

8. The process according to claim 6, wherein the apertures are configured so that a ratio of a solid portion of the mask to areas of the apertures is greater than 3:1.

9. The process according to claim 8, wherein the apertures are configured so that the ratio of the solid portion of the mask to the areas of the apertures is about 8:1.

10. The process according to claim 6, wherein a distance between adjacent apertures along a direction is greater than a width of the apertures in the same direction.

11. The process according to claim 6, wherein the apertures are arranged on rows and columns along a first direction and a second direction, respectively, and wherein a first distance and a second distance between adjacent apertures respectively along the first direction and the second direction are respectively greater than twice a first width of the apertures in the first direction and greater than twice a second width of the apertures in the second direction.

12. The process according to claim 1, wherein a ratio of an area of the structural layer in a membrane region to areas of cross-sections of each of the plurality of trenches is greater than 3:1.

13. The process according to claim 12, wherein the ratio of the area of the structural layer in a membrane region to areas of cross-sections of each of the plurality of trenches is about 8:1.

14. The process according to claim 1, wherein the membrane has a thickness of between 1 µm and 3 µm.

15. The process according to claim 1, wherein the membrane is made of monocrystalline silicon.

16. A process comprising:
   forming a microelectromechanical device including:
      forming a structural layer on a dielectric layer on a semiconductor substrate, the structural layer having an inner portion and an outer portion
      opening a plurality of trenches through the structural layer, the plurality of trenches exposing a portion of the dielectric layer;
      selectively removing a sacrificial portion of the dielectric layer through the plurality of trenches so as to cause a corresponding portion of the structural layer to be suspended, thereby forming a membrane, the membrane being configured to deform in response to a force applied thereto and configured to generate a signal indicative of the deformation; and
      closing the plurality of trenches, the closing the plurality of trenches including exposing the structural layer to an annealing temperature for a time interval.

17. The process according to claim 16, wherein exposing the microelectromechanical device to an annealing temperature for a time interval causes atoms of the membrane to migrate.

18. The process according to claim 16, wherein the annealing temperature is between approximately 1100° C. and approximately 1250° C.

19. The process according to claim 16, wherein the time interval has a duration of between approximately 5 minutes and approximately 30 minutes.

20. The process according to claim 16, wherein opening the plurality of trenches includes forming a mask on the structural layer and etching the structural layer using the mask.

* * * * *